(12) United States Patent
DeCesaris et al.

(10) Patent No.: US 10,386,425 B2
(45) Date of Patent: Aug. 20, 2019

(54) METHOD AND SYSTEM FOR MANAGING POWER FAULTS

(71) Applicant: Lenovo Enterprise Solutions (Singapore) Pte. Ltd., Singapore (SG)

(72) Inventors: Michael DeCesaris, Carrboro, NC (US); Luke D. Remis, Raleigh, NC (US); Gregory D. Sellman, Morrosville, NC (US); Brian C. Totten, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1142 days.

(21) Appl. No.: 14/223,021

(22) Filed: Mar. 24, 2014

(65) Prior Publication Data

US 2015/0268310 A1 Sep. 24, 2015

(51) Int. Cl.
| | |
|---|---|
| *G01R 31/00* | (2006.01) |
| *G01R 31/40* | (2014.01) |
| *G06F 1/28* | (2006.01) |
| *G06F 1/30* | (2006.01) |
| *H02H 3/00* | (2006.01) |

(52) U.S. Cl.
CPC ........... *G01R 31/40* (2013.01); *G06F 1/28* (2013.01); *G06F 1/30* (2013.01); *H02H 3/00* (2013.01)

(58) Field of Classification Search
None
See application file for complete search history.

(56) References Cited

U.S. PATENT DOCUMENTS

| | | | |
|---|---|---|---|
| 5,239,441 A | 8/1993 | Fox et al. | |
| 6,768,694 B2 | 7/2004 | Anand et al. | |
| 7,085,182 B2 | 8/2006 | Collura et al. | |
| 8,988,098 B2 * | 3/2015 | Partee | G01R 31/40 |
| | | | 324/764.01 |
| 2009/0109590 A1 | 4/2009 | Girot et al. | |

(Continued)

FOREIGN PATENT DOCUMENTS

| | | |
|---|---|---|
| CN | 2829072 Y | 10/2006 |
| CN | 203118893 U | 8/2013 |

(Continued)

OTHER PUBLICATIONS

Author Unknown, "Programmable read-only memory", Programmable read-only memory—Wikipedia, the free encyclopedia, http://en.wikipedia.org/wiki/Programmable_read-only_memory, accessed on Mar. 18, 2014, pp. 1-3.

*Primary Examiner* — Vincent Q Nguyen
(74) *Attorney, Agent, or Firm* — Jeffrey L. Streets

(57) ABSTRACT

A method of determining power fault information using a voltage regulator-down (VRD) device having a fault-pin output. The method may include receiving a fault indication from one of a plurality of fault detection devices, correlating the received fault indication with a timing signal having a predetermined time duration, applying a voltage change on the fault-pin output of the VRD device for the predetermined time duration corresponding to the timing signal, and applying the voltage change on the fault-pin output to a plurality of fuses. Based on the predetermined time duration associated with the applied voltage change, the plurality of fuses may be blown according to a binary pattern indicative of a fault type associated with the fault indication.

20 Claims, 5 Drawing Sheets

(56) References Cited

U.S. PATENT DOCUMENTS

| | | | |
|---|---|---|---|
| 2009/0190422 A1* | 7/2009 | Khoja | G11C 17/18 |
| | | | 365/200 |
| 2011/0002068 A1 | 1/2011 | Hu et al. | |
| 2013/0138366 A1 | 5/2013 | Yan et al. | |
| 2014/0143597 A1* | 5/2014 | Chen | G06F 11/0793 |
| | | | 714/15 |

FOREIGN PATENT DOCUMENTS

| | | |
|---|---|---|
| CN | 203126544 U | 8/2013 |
| EP | 1408516 A1 | 4/2004 |

\* cited by examiner

METHOD AND SYSTEM FOR MANAGING POWER FAULTS

BACKGROUND a. Field of the Invention

The present invention generally relates to evaluating system integrity, and more particularly, to determining power faults in systems.

b. Background of Invention

Voltage regulator devices may be used to provide one or more constant voltages to electronic circuitry within a system. Voltage regulator-down (VRD) devices may include, among other things, voltage regulator devices having components mounted on a microprocessor mother board. In some scenarios, it may be difficult to debug a failed VRD device when, for example, the management subsystem used to report the VRD failure is itself affected by the failed VRD. Also, it may be challenging to distinguish which VRD has asserted a fault pin, since any fault signal assertion may result in the power-supply to the system being disabled.

BRIEF SUMMARY

According to at least one exemplary embodiments, a method of determining power fault information using a voltage regulator-down (VRD) device having a fault-pin output is provided. The method may include receiving a fault indication from one of a plurality of fault detection devices, correlating the received fault indication with a timing signal having a predetermined time duration, applying a voltage change on the fault-pin output of the VRD device for the predetermined time duration corresponding to the timing signal, and applying the voltage change on the fault-pin output to a plurality of fuses. Based on the predetermined time duration associated with the applied voltage change, the plurality of fuses are blown according to a binary pattern indicative of a fault type associated with the fault indication.

According to another exemplary embodiment, a method of determining a power fault using a plurality of voltage regulator-down (VRD) devices having a common fault-pin output is provided. The method may include receiving a fault indication at one of the plurality of VRD devices, determining the address of the one of the plurality of VRD devices receiving the fault indication, correlating the address of the one of the plurality of VRD devices receiving the fault indication with a timing signal having a predetermined time duration, applying a voltage change on the common fault-pin output of the plurality of VRD devices for the predetermined time duration corresponding to the timing signal, and applying the voltage change on the common fault-pin output to a plurality of fuses for the predetermined time duration. Based on the predetermined time duration associated with the applied voltage change, the plurality of fuses are blown according to a binary pattern indicative of the address of the one of the plurality of VRD devices.

According to yet another exemplary embodiment, a voltage regulator-down (VRD) device for generating power fault information may include a plurality of fault registers that each provide an indication of a detected fault and a timer unit coupled to the plurality of fault registers, whereby the timer unit generates a timing signal having one of a plurality of predetermined time durations selectable based on each indication of the detected fault corresponding to the plurality of fault registers. A switch device coupled to both the timer unit and a fault-pin output applies a voltage change of the fault-pin output for the one of the plurality of predetermined time durations selectable based on each indication of the detected fault corresponding to the plurality of fault registers.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
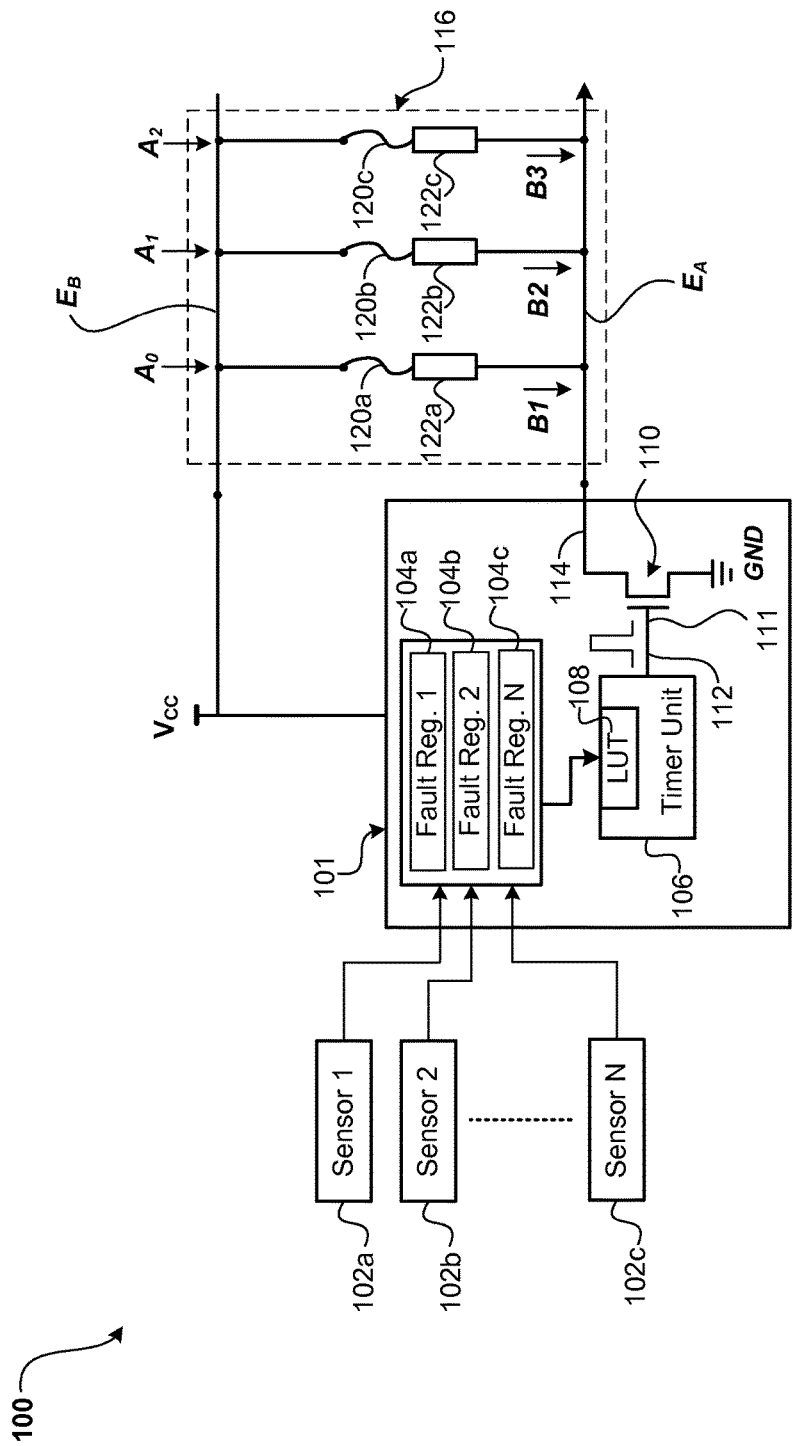
FIG. 1 depicts a block diagram of an exemplary VRD device that generates power fault information according to one embodiment.

According to the one or more exemplary embodiments described herein, one or more voltage regulation devices such as a VRD device that is located within a system (e.g., a server system) may be used to generate fault information when the system is powered down or in the process of being powered down due to a fault. The VRD device may, therefore, generate the fault information either in the absence of power being provided to the system (e.g., main power to server shut down) or based on a fault reporting inability (e.g., fault management subsystem disabled) experienced by the system.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 depicts a block diagram 100 of an exemplary VRD device 101 that generates power fault information according to one embodiment. As illustrated, the VRD device 101 may include a plurality of fault registers 104a-104c, a timer unit 106 having a lookup table (LUT) 108, and a switch device such as field effect transistor (FET) device 110. The plurality of fault registers 104a-104c are coupled to the LUT 108 within the timer unit 106. The output 112 of the timer unit 106 is coupled to the gate input 111 of the FET switch 110, while the output 114 of the FET switch 110 is accordingly coupled to a binary fuse system 116. The output 114 of the FET switch 110 may also include the fault-pin output of the VRD device 101, whereby the fault pin asserts when, under a power failure, power may be provided to the system by the power supply. For example, under a detected short circuit condition, a change of state (e.g., voltage change) on the fault-pin output 114 may assert shutting off the output of the system's power supply to avoid further system damage and/or a fire.

As further shown in FIG. 1, the binary fuse system 116 may include a plurality of parallel connected fuses 120a-120c. Each of the fuses 120a-120c has a corresponding series resistor 122a-122c. Each bit-position of the binary fuse system 116 therefore includes a fuse and its series resistor. For example, bit-position $A_0$ includes fuse 120a and series resistor 122a, bit-position $A_1$ includes fuse 120b and series resistor 122b, and bit-position $A_2$ includes fuse 120c and series resistor 122c. As depicted, one end $E_A$ of this exemplary 3-bit binary fuse system 116 is electrically coupled to output 114 of the FET switch 110, while the other end $E_B$ of the binary fuse system 116 is electrically coupled to power supply rail $V_{CC}$. Once the FET switch 110 is activated (switched ON), current flows through each branch B1-B3 of the fuse system 116.

Based on the duration of the current flow and resistor values, the fuses may be designed to blow (e.g., open circuit) at different times. For example, when the fuses are not blown, they be assigned a binary value of '1'. Conversely, when the fuses are blown, they be assigned a binary value of '0'. Thus, in an unblown state, the binary fuse system 116 may include a binary pattern of '111'. More specifically, since branch B1 has an unblown fuse, it may be assigned a binary value of '1'. Similarly, since branches B2 and B3 have unblown fuses, they may also each be assigned a binary value of '1'. However, based on the amount of time (i.e., a predetermined time duration) that current flows through each branch B1-B3 of the fuse system 116 under the activation of the FET switch 110, certain fuses may blow.

For example, based on a predetermined time duration of $t_1$ (e.g., 50 milliseconds), the current flow may cause fuse 120a within branch B1 to blow generating a binary pattern of '011'. For a longer predetermined time duration of $t_2$ (e.g., 100 milliseconds), the current flow may accordingly cause both fuses 120a and 120b within respective branches B1 and B2 to blow generating a binary pattern of '001'. Moreover, by further increasing the predetermined time duration to $t_3$ (e.g., 150 milliseconds), the current flow may cause all the fuses 120a-120c within respective branches B1-B3 to blow generating a binary pattern of '000'.

A plurality of sensor or fault detection devices 102a-102c may be coupled to the plurality of fault registers 104a-104c. More specifically, sensor or fault detection device 102a may be coupled to fault register 104a, sensor or fault detection device 102b may be coupled to fault register 104b, and sensor or fault detection device 102c may be coupled to fault register 104c. In some implementations, any number of sensor or fault detection devices and corresponding fault registers may be utilized based on system architecture.

Each fault register may provide, among other things, an indication of a fault that is received from its corresponding sensor or fault detection device. For example, fault register 104a may provide an indication of a fault that is received from sensor or fault detection device 102a. For instance, sensor 102a may detect an over-temperature condition. Fault register 104a may then, based on the detected over-temperature condition, set one or more fields within its register to provide an indication that an over-temperature condition has occurred. According to another example, fault register 104b may provide an indication of a fault that is received from sensor or fault detection device 102b. For instance, sensor 102b may detect an over-current condition. Fault register 104b may then, based on the detected over-current condition, set one or more fields within its register to provide an indication that an over-current condition has occurred. Also, fault register 104c may, for example, provide an indication of a fault that is received from sensor or fault detection device 102c. For instance, sensor 102c may detect an over-voltage condition. Fault register 104c may then, based on the detected over-voltage condition, set one or more fields within its register to provide an indication that an over-voltage condition has occurred. Similarly, additional fault registers and corresponding sensors or fault detection devices may be implemented to detect and provide an indication of other conditions such as, but not limited to, an under-current condition or an under-voltage condition.

Within the timer unit 106, the LUT 108 may provide a mapping or correlation between the faults indicated by the fault registers 104a-104c and a corresponding predetermined time duration value. For example, a fault indicated by fault register 104a may be mapped or correlated by the LUT 108 to predetermined time duration $t_1$ (e.g., 50 milliseconds), a fault indicated by fault register 104b may be mapped or correlated by the LUT 108 to predetermined time duration $t_2$ (e.g., 100 milliseconds), and a fault indicated by fault register 104c may be mapped or correlated by the LUT 108 to predetermined time duration $t_3$ (e.g., 150 milliseconds). The LUT 108 may be implemented in hardware, firmware, software, or any combination thereof.

The timer unit 106 may generate a timing signal that corresponds to the predetermined time duration indicated by LUT 108. For example, if the fault indicated by fault register 104a is mapped or correlated by the LUT 108 to predetermined time duration $t_1$ (e.g., 50 milliseconds), the timer unit 106 accordingly generates a pulse signal having a time period of $t_1$ (e.g., 50 milliseconds). If the fault indicated by fault register 104b is mapped or correlated by the LUT 108 to predetermined time duration $t_2$ (e.g., 100 milliseconds), the timer unit 106 accordingly generates a pulse signal having a time period of $t_2$ (e.g., 100 milliseconds). If, however, the fault indicated by fault register 104c is mapped or correlated by the LUT 108 to predetermined time duration $t_3$ (e.g., 150 milliseconds), the timer unit 106 accordingly generates a pulse signal having a time period of $t_3$ (e.g., 150 milliseconds).

As depicted, the gate input 111 of the FET switch 110 receives the timing signal generated at the output 112 of the timer unit 106. For example, if the gate input 111 of the FET switch 110 receives the generated pulse signal having time period $t_1$ (e.g., 50 milliseconds) from the timer unit 106, the FET 110 is switched ON for duration $t_1$ (i.e., 50 milliseconds). If, for example, the gate input 111 of the FET switch 110 receives the generated pulse signal having time period $t_2$ (e.g., 100 milliseconds) from the timer unit 106, the FET 110 is switched ON for duration $t_2$ (i.e., 100 milliseconds). Similarly, if, for example, the gate input 111 of the FET switch 110 receives the generated pulse signal having time period $t_3$ (e.g., 150 milliseconds) from the timer unit 106, the FET 110 is switched ON for duration $t_3$ (i.e., 150 milliseconds). Once the FET 110 is switched ON for duration $t_1$, $t_2$, or $t_3$, current is drawn from supply rail $V_{cc}$ to ground GND through the branches B1-B3 of the fuse system 116 for duration $t_1$, $t_2$, or $t_3$.

Figure 2:
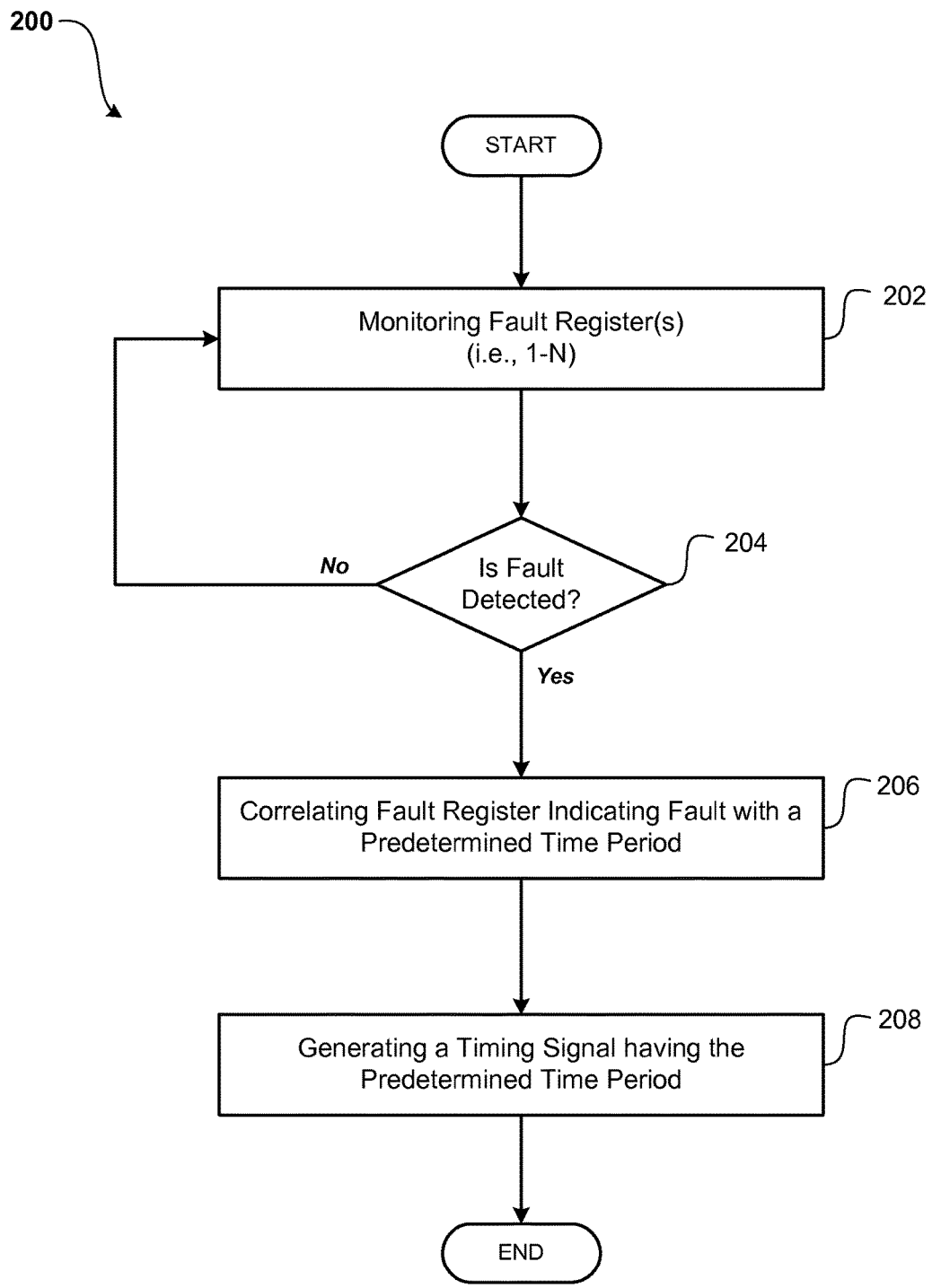
FIG. 2 depicts a process flow diagram describing the operation an exemplary timer unit associated with the VRD device of FIG. 1 according to one embodiment.

FIG. 2 depicts a process flow diagram 200 (i.e., VRD fault determination program) describing the operation of an exemplary timer unit 106 associated with the VRD device 101 of FIG. 1, according to one embodiment. FIG. 2 will be described with the aid of the exemplary embodiment of FIG. 1.

At 202, the one or more fields associated with the fault registers 104a-104c (FIG. 1) may be monitored by the LUT 108 (FIG. 1) within the timer unit 106 (FIG. 1). The LUT 108 may detect any changes to one or more fields within one of the fault registers 104a-104c (FIG. 1) as an indication of a detected fault. For example, sensor or fault detection device 102a (FIG. 1) may detect an over-current condition. The detected over-current condition may then be written to the fault register 104a (FIG. 1) coupled to sensor or fault detection device 102a (FIG. 1), whereby the detected over-current condition may be written to the fault register 104a (FIG. 1) as a change to one (e.g., 1-bit flag) or more fields (e.g., n-bit code) within the register 104a (FIG. 1). Accordingly, at 204, the LUT 108 (FIG. 1) may detect whether a fault has occurred based on, for example, a change to the one (e.g., 1-bit flag) or more fields (e.g., n-bit code) within one of the fault registers 104a-104c (FIG. 1).

If no fault is detected (204), the process of monitoring the fault registers 104a-104c (FIG. 1) continues (202). If, however, a fault is detected (204), at 206 the fault register indicating the fault is correlated with a predetermined time period. For example, when a change to the one (e.g., 1-bit flag) or more fields (e.g., n-bit code) within fault register 104a (FIG. 1) is detected (204), the LUT 108 (FIG. 1) may map or correlate fault register 104a (FIG. 1) to predetermined time duration $t_1$ (e.g., 50 milliseconds). Alternatively, when, for example, a change to the one (e.g., 1-bit flag) or more fields (e.g., n-bit code) within fault register 104b (FIG. 1) is detected (204), the LUT 108 (FIG. 1) may map or correlate fault register 104b (FIG. 1) to predetermined time duration $t_2$ (e.g., 100 milliseconds). Also, for example, when a change to the one (e.g., 1-bit flag) or more fields (e.g., n-bit code) within fault register 104c (FIG. 1) is detected (204), the LUT 108 (FIG. 1) may map or correlate fault register 104c (FIG. 1) to predetermined time duration $t_3$ (e.g., 150 milliseconds).

At 208, a timing signal having the predetermined time duration is generated. Accordingly, once the LUT 108 (FIG. 1) provides a predetermined time duration based on the mapping or correlation (206), the timer unit 106 (FIG. 1) generates a timing signal having a time period corresponding to the predetermined time duration (208). For example, when the LUT 108 (FIG. 1) maps the detected fault indicated within register 104a (FIG. 1) to predetermined time duration $t_1$ (e.g., 50 milliseconds), the timer unit 106 (FIG. 1) may accordingly generate a timing signal having a pulse period of predetermined time duration $t_1$ (e.g., 50 milliseconds). Alternatively, when, for example, the LUT 108 (FIG. 1) maps the detected fault indicated within register 104b (FIG. 1) to predetermined time duration $t_2$ (e.g., 100 milliseconds), the timer unit 106 (FIG. 1) may accordingly generate a timing signal having a pulse period of predetermined time duration $t_2$ (e.g., 100 milliseconds). Also, when, for example, the LUT 108 (FIG. 1) maps the detected fault indicated within register 104c (FIG. 1) to predetermined time duration $t_3$ (e.g., 150 milliseconds), the timer unit 106 (FIG. 1) may accordingly generate a timing signal having a pulse period equivalent to predetermined time duration $t_3$ (e.g., 150 milliseconds).

In operation, the timing signal from the timer unit 106 (FIG. 1) turns FET switch 110 (FIG. 1) ON according to the mapped or correlated predetermined time duration. For example, the predetermined time duration of $t_1$ (e.g., 50 milliseconds) corresponding to a detected fault indicated by fault register 104a (FIG. 1) is used to generate a timing signal having a pulse period of $t_1$ (e.g., 50 milliseconds). Applying the timing signal having a pulse period of $t_1$ (e.g., 50 milliseconds) to the gate 111 (FIG. 1) of FET 110 (FIG. 1) accordingly turns the FET 110 to an ON state for the predetermined time duration of $t_1$ (i.e., 50 milliseconds).

As previously described, once the FET 110 (FIG. 1) is switched ON for duration $t_1$, $t_2$, or $t_3$, current is drawn from supply rail $V_{cc}$ (FIG. 1) to ground GND (FIG. 1) through the branches B1-B3 (FIG. 1) of the fuse system 116 (FIG. 1) for duration $t_1$, $t_2$, or $t_3$. Thus, based on the FET 110 (FIG. 1) being switched to an ON state for the predetermined time duration of $t_1$ (i.e., 50 milliseconds), current is drawn from supply rail $V_{cc}$ to ground GND through the branches B1-B3 (FIG. 1) of the fuse system 116 (FIG. 1) for duration $t_1$. Over duration $t_1$, the fuse system 116 (FIG. 1) may be programmed such that fuse 120a (FIG. 1) within branch B1 (FIG. 1) blows to create binary pattern '011'.

Alternatively, for example, based on the FET 110 (FIG. 1) being switched to an ON state for the predetermined time duration of $t_2$ (i.e., 100 milliseconds), current is drawn from supply rail $V_{cc}$ (FIG. 1) to ground GND (FIG. 1) through the branches B1-B3 (FIG. 1) of the fuse system 116 for duration $t_2$. Over duration $t_2$, the fuse system 116 (FIG. 1) may be programmed such that fuse 120b (FIG. 1) within branch B2 (FIG. 1) additionally blows to create binary pattern '001'.

Also, based on the FET 110 (FIG. 1) being switched to an ON state for the predetermined time duration of $t_3$ (i.e., 150 milliseconds), current is drawn from supply rail $V_{cc}$ (FIG. 1) to ground GND (FIG. 1) through the branches B1-B3 (FIG. 1) of the fuse system 116 (FIG. 1) for duration $t_3$. Over duration $t_3$, the fuse system 116 (FIG. 1) may be programmed such that fuse 120c within branch B3 blows following the blowing of fuses 120a-120b to create binary pattern '000'.

When a fault is detected, in addition to the timing signal blowing the binary fuse system 116 (FIG. 1) according to a preset pattern, the fault pin output 114 (FIG. 1) may inhibit the power supply from delivering voltage to the various circuits of the system (e.g., server system). However, the fault associated with system power may be determined without the need to power-up the system, which in some scenarios may present a risk of fire. Therefore, an ohm meter, a multi-meter, of other suitable instrumentation device may be utilized to ascertain the blown or unblown status of each the fuses 120a-120c (FIG. 1). For example, an ohm meter or continuity tester may determine the presence of either an open circuit indicative of a blow fuse along each branch B1-B3 (FIG. 1), or a closed circuit suggesting that the fuse at each branch is intact.

For example, the ohm meter may measure a binary pattern of '111', whereby none of the fuses are blown. Thus, this may provide an indication of no power faults detected by the fault registers 104a-104c (FIG. 1). According to another example, the ohm meter may measure a binary pattern of '011', whereby one of the fuses are blown. This binary pattern of '011' may provide an indication of a power fault detected by fault register 104a (FIG. 1). Since the system engineer may attribute faults in fault register 104a (FIG. 1) to a particular detected fault (e.g., over-temperature condition), no power to the system is required in order to read the fault data information associated with the one or more fields within fault register 104a (FIG. 1).

According to yet another example, the ohm meter may measure a binary pattern of '001', whereby two of the fuses are blown. This binary pattern of '001' may provide an indication of a power fault detected by fault register 104b (FIG. 1). Since the system engineer may attribute faults in fault register 104b (FIG. 1) to a particular detected fault (e.g., over-current condition), no power to the system is required in order to read the fault data information associated with the one or more fields within fault register 104b (FIG. 1). Also, in yet another example, the ohm meter may measure a binary pattern of '000', whereby all of the fuses are blown. This binary pattern of '000' may provide an indication of a power fault detected by fault register 104c (FIG. 1). Since the system engineer may attribute faults in fault register 104c (FIG. 1) to a particular detected fault (e.g., over-voltage condition), no power to the system is required in order to read the fault data information associated with the one or more fields within fault register 104a (FIG. 1).

Figure 3:
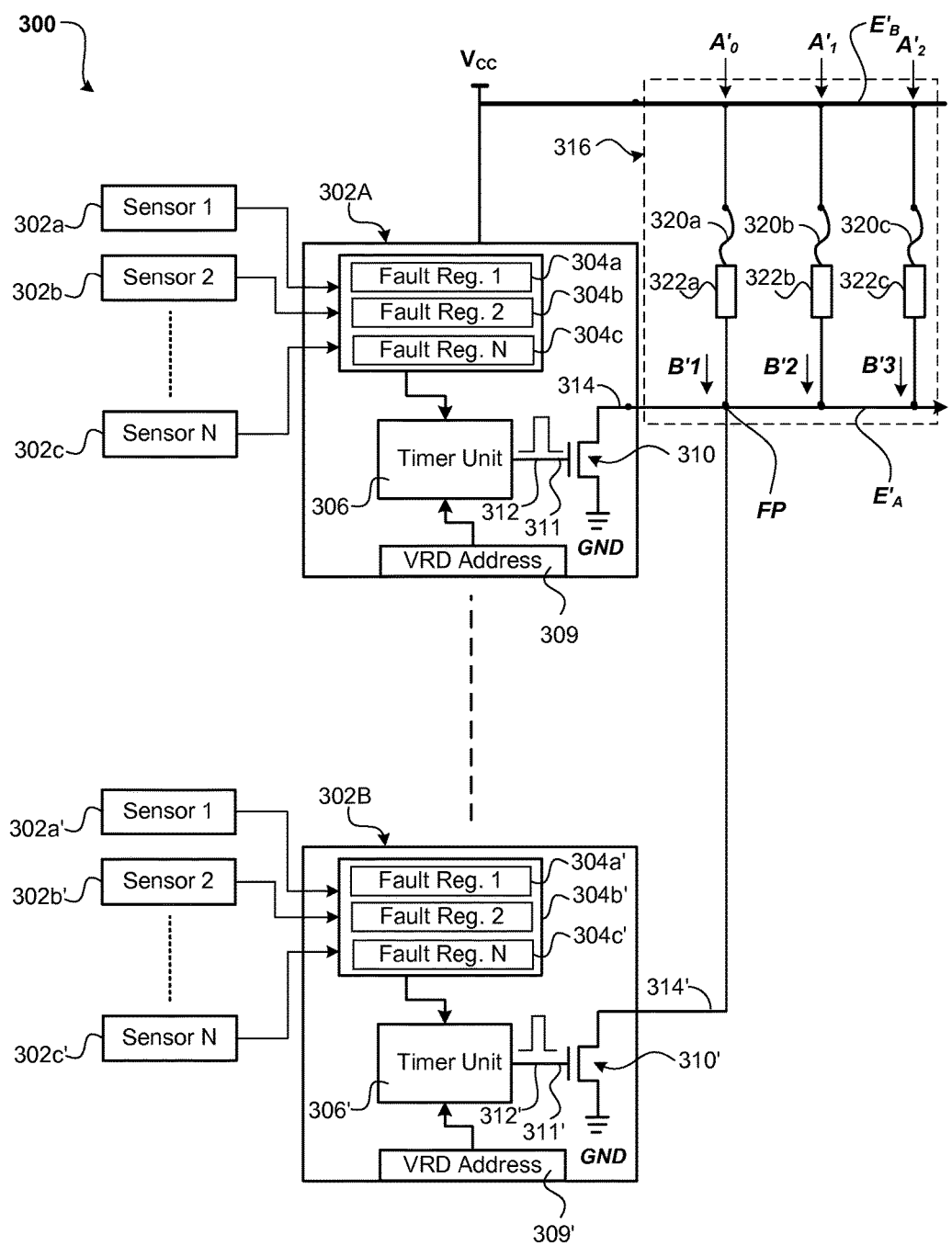
FIG. 3 depicts a block diagram of exemplary VRD devices for generating power fault information according to another embodiment.

FIG. 3 depicts a block diagram 300 of a plurality of substantially identical exemplary VRD devices 302A, 302B that generate power fault information according to another embodiment. As illustrated, VRD device 302A may include a plurality of fault registers 304a-304c, a timer unit 306, a VRD address identifier 309, and a switch device such as field effect transistor (FET) device 310. The plurality of fault registers 304a-304c are coupled to the timer unit 306. The output 312 of the timer unit 306 is coupled to the gate input 311 of the FET switch 310, while the output 314 of the FET switch 310 is accordingly coupled to a binary fuse system 316. The output 314 of the FET switch 310 may also include a common fault-pin output associated with both the VRD devices 302A, 302B, as indicated by FP. The common fault pin asserts when, under a power failure, power may be provided to the system by the power supply. For example, under a detected short circuit condition, a change of state (e.g., voltage change) on the fault-pin output FP may assert shutting off the output of the system's power supply to avoid further system damage and/or a fire.

As further illustrated by FIG. 3, VRD device 302B may be substantially identical to VRD device 302A. VRD device 302B may include a plurality of fault registers 304a'-304c', a timer unit 306', a VRD address identifier 309', and a switch device such as field effect transistor (FET) device 310'. The plurality of fault registers 304a'-304c' are coupled to the timer unit 306'. The output 312' of the timer unit 306' is coupled to the gate input 311' of the FET switch 310', while the output 314' of the FET switch 310' is accordingly coupled to a binary fuse system 316. The output 314' of the FET switch 310' may also include the common fault-pin output associated with both the VRD devices 302A, 302B, as indicated by FP. The common fault pin asserts when, under a power failure, power may be provided to the system by the power supply. For example, under a detected short circuit condition, a change of state (e.g., voltage change) on the fault-pin output FP may assert shutting off the output of the system's power supply to avoid further system damage and/or a fire.

As further shown in FIG. 3, the binary fuse system 316 may include a plurality of parallel connected fuses 320a-320c. Each of the fuses 320a-320c has a corresponding series resistor 322a-322c. Each bit-position of the binary fuse system 316 therefore includes a fuse and its series resistor. For example, bit-position $A'_0$ includes fuse 320a and series resistor 322a, bit-position $A'_1$ includes fuse 320b and series resistor 322b, and bit-position $A'_2$ includes fuse 320c and series resistor 322c. As depicted, one end $E'_A$ of this exemplary 3-bit binary fuse system 316 is electrically coupled to output 314 of the FET switch 310, while the other end $E'_B$ of the binary fuse system 316 is electrically coupled to power supply rail $V_{CC}$. Once the FET switch 310 is activated (switched ON), current flows through each branch B1-B3 of the fuse system 316. As depicted, end $E'_A$ of the exemplary 3-bit binary fuse system 316 is also electrically coupled to output 314' of the FET switch 310'. Thus, once FET switch 310' is activated (switched ON), current accordingly flows through each branch B'1-B'3 of the fuse system 316.

It may be appreciated that any number of electrically coupled VRD devices may be utilized. For brevity, FIG. 3 illustrates two VRD devices 302A, 302B, however, any number of VRD devices may be coupled such that their switch device (e.g., FET switch) outputs are coupled to end $E'_A$ of the binary fuse system 316.

Based on the duration of the current flow and resistor values, the fuses may be designed to blow (e.g., open circuit) at different times. For example, when the fuses are not blown, they be assigned a binary value of '1'. Conversely, when the fuses are blown, they be assigned a binary value of '0'. Thus, in an unblown state, the binary fuse system 316 may include a binary pattern of '111'. More specifically, since branch B'1 has an unblown fuse, it may be assigned a binary value of '1'. Similarly, since branches B'2 and B'3 have unblown fuses, they may also each be assigned a binary value of '1'. However, based on the amount of time (i.e., a predetermined time duration) that current flows through each branch B'1-B'3 of the fuse system 316 under the activation of either FET switch 310 or 310', certain fuses may blow.

For example, based on a predetermined time duration of $t_1$ (e.g., 50 milliseconds), the current flow may cause fuse 320a within branch B'1 to blow generating a binary pattern of '011'. For a longer predetermined time duration of $t_2$ (e.g., 100 milliseconds), the current flow may accordingly cause both fuses 320a and 320b within respective branches B'1 and B'2 to blow generating a binary pattern of '001'. Moreover, by further increasing the predetermined time duration to $t_3$ (e.g., 150 milliseconds), the current flow may cause all the fuses 320a-320c within respective branches B'1-B'3 to blow generating a binary pattern of '000'.

As illustrated, a plurality of sensor or fault detection devices 302a-302c may be coupled to the plurality of fault registers 304a-304c. More specifically, sensor or fault detection device 302a may be coupled to fault register 304a, sensor or fault detection device 302b may be coupled to fault register 304b, and sensor or fault detection device 302c may be coupled to fault register 304c. In some implementations, any number of sensor or fault detection devices and corresponding fault registers may be utilized based on system architecture. Similarly, a plurality of sensor or fault detection devices 302a'-302c' may be coupled to the plurality of fault registers 304a'-304c'. More specifically, sensor or fault detection device 302a' may be coupled to fault register 304a', sensor or fault detection device 302b' may be coupled to fault register 304b', and sensor or fault detection device 302c' may be coupled to fault register 304c'. In some implementations, any number of sensor or fault detection devices and corresponding fault registers may be utilized based on system architecture.

Each fault register may provide, among other things, an indication of a fault that is received from its corresponding sensor or fault detection device. For example, fault register 304a may provide an indication of a fault that is received from sensor or fault detection device 302a. For instance, sensor 302a may detect an over-temperature condition. Fault register 304a may then, based on the detected over-temperature condition, set one or more fields within its register to provide an indication that an over-temperature condition has occurred. According to another example, fault register 304b may provide an indication of a fault that is received from sensor or fault detection device 302b. For instance, sensor 302b may detect an over-current condition. Fault register 304b may then, based on the detected over-current condition, set one or more fields within its register to provide an indication that an over-current condition has occurred. Also, fault register 304c may, for example, provide an indication of a fault that is received from sensor or fault detection device 302c. For instance, sensor 302c may detect an over-voltage condition. Fault register 304c may then, based on the detected over-voltage condition, set one or more fields within its register to provide an indication that an over-voltage condition has occurred. Similarly, additional fault registers and corresponding sensors or fault detection devices may be implemented to detect and provide an indication of other conditions such as, but not limited to, an under-current condition or an under-voltage condition.

Similarly, for example, fault register 304a' may provide an indication of a fault that is received from sensor or fault detection device 302a'. For instance, sensor 302a' may detect an over-temperature condition. Fault register 304a' may then, based on the detected over-temperature condition, set one or more fields within its register to provide an indication that an over-temperature condition has occurred. According to another example, fault register 304b' may provide an indication of a fault that is received from sensor or fault detection device 302b'. For instance, sensor 302b' may detect an over-current condition. Fault register 304b' may then, based on the detected over-current condition, set one or more fields within its register to provide an indication that an over-current condition has occurred. Also, fault register 304c' may, for example, provide an indication of a fault that is received from sensor or fault detection device 302c'. For instance, sensor 302c' may detect an over-voltage condition. Fault register 304c' may then, based on the detected over-voltage condition, set one or more fields within its register to provide an indication that an over-voltage condition has occurred. Similarly, additional fault registers and corresponding sensors or fault detection devices may be implemented to detect and provide an indication of other conditions such as, but not limited to, an under-current condition or an under-voltage condition.

The VRD address indicator 309 may, for example, include an address value corresponding to VRD device 302A, while VRD address indicator 309' may, for example, include an address value corresponding to VRD device 302B. Each VRD address indicator 309, 309' may, among other things, provide location information associated with its corresponding VRD device (309 or 309') within the system (e.g., server system). According to one implementation, the VRD address may be set by toggling a plurality of switches between either 0V or $V_{CC}$ to generate a binary address code. In other implementations, a binary address code may be established by hardwiring each designated bit of the binary address code either to 0V or $V_{CC}$.

At the timer unit 306 of VRD device 302A, the binary address code within the VRD address 309 is mapped or correlated with a corresponding predetermined time duration value based on a fault being indicated by one of the fault registers 304a-304c. For example, a fault may be indicated by one of fault registers 304a-304c. Once the timer unit 306 receives this indication of the fault, the timer unit 306 maps or correlates the binary address code within the VRD address 309 to predetermined time duration $t_1$ (e.g., 50 milliseconds). Similarly, at the timer unit 306' of VRD device 302B, the binary address code within the VRD address 309' is mapped or correlated with a corresponding predetermined time duration value based on a fault being indicated by one of the fault registers 304a'-304c'. For example, a fault may be indicated by one of fault registers 304a'-304c'. Once the timer unit 306' receives this indication of the fault, the timer unit 306' maps or correlates the binary address code within the VRD address 309 to predetermined time duration $t_2$ (e.g., 100 milliseconds). In the event that additional VRD devices (not shown) are used, the corresponding binary address codes within the additional VRD devices may be mapped to other predetermined time durations (e.g., $t_3$=150 milliseconds, $t_4$=200 milliseconds, etc.)

The timer units 306, 306' may each generate timing signals that correspond to the predetermined time durations indicated by the binary address codes within the VRD addresses 309, 309' of each of the respective VRD devices 302A, 302B. For example, based on a fault indicated by one of fault registers 304a-304c, the binary address code within VRD addresses 309 is mapped or correlated to predetermined time duration $t_1$ (e.g., 50 milliseconds). Thus, the timer unit 306 accordingly generates a pulse signal having a time period of $t_1$ (i.e., 50 milliseconds). Alternatively, for example, based on a fault indicated by one of fault registers 304a'-304c', the binary address code within VRD addresses 309' is mapped or correlated to predetermined time duration $t_2$ (e.g., 100 milliseconds). Thus, the timer unit 306' accordingly generates a pulse signal having a time period of $t_2$ (i.e., 100 milliseconds).

As depicted, within VRD device 302A, the gate input 311 of the FET switch 310 receives the timing signal generated at the output 312 of the timer unit 306. For example, if the gate input 311 of the FET switch 310 receives the generated pulse signal having time period $t_1$ (e.g., 50 milliseconds) from the timer unit 306, the FET 310 is switched ON for duration $t_1$ (i.e., 50 milliseconds). If, for example, the gate input 311' of the FET switch 310' receives the generated pulse signal having time period $t_2$ (e.g., 100 milliseconds) from the timer unit 306', the FET 310' is switched ON for duration $t_2$ (i.e., 100 milliseconds). Once FET 310 is switched ON for duration $t_1$, current is drawn from supply rail $V_{cc}$ to ground GND through the branches B'1-B'3 of the fuse system 316 for duration $t_1$. However, when FET 310' is switched ON for duration $t_2$, current is drawn from supply rail $V_{cc}$ to ground GND through the branches B'1-B'3 of the fuse system 316 for duration $t_2$.

Figure 4:
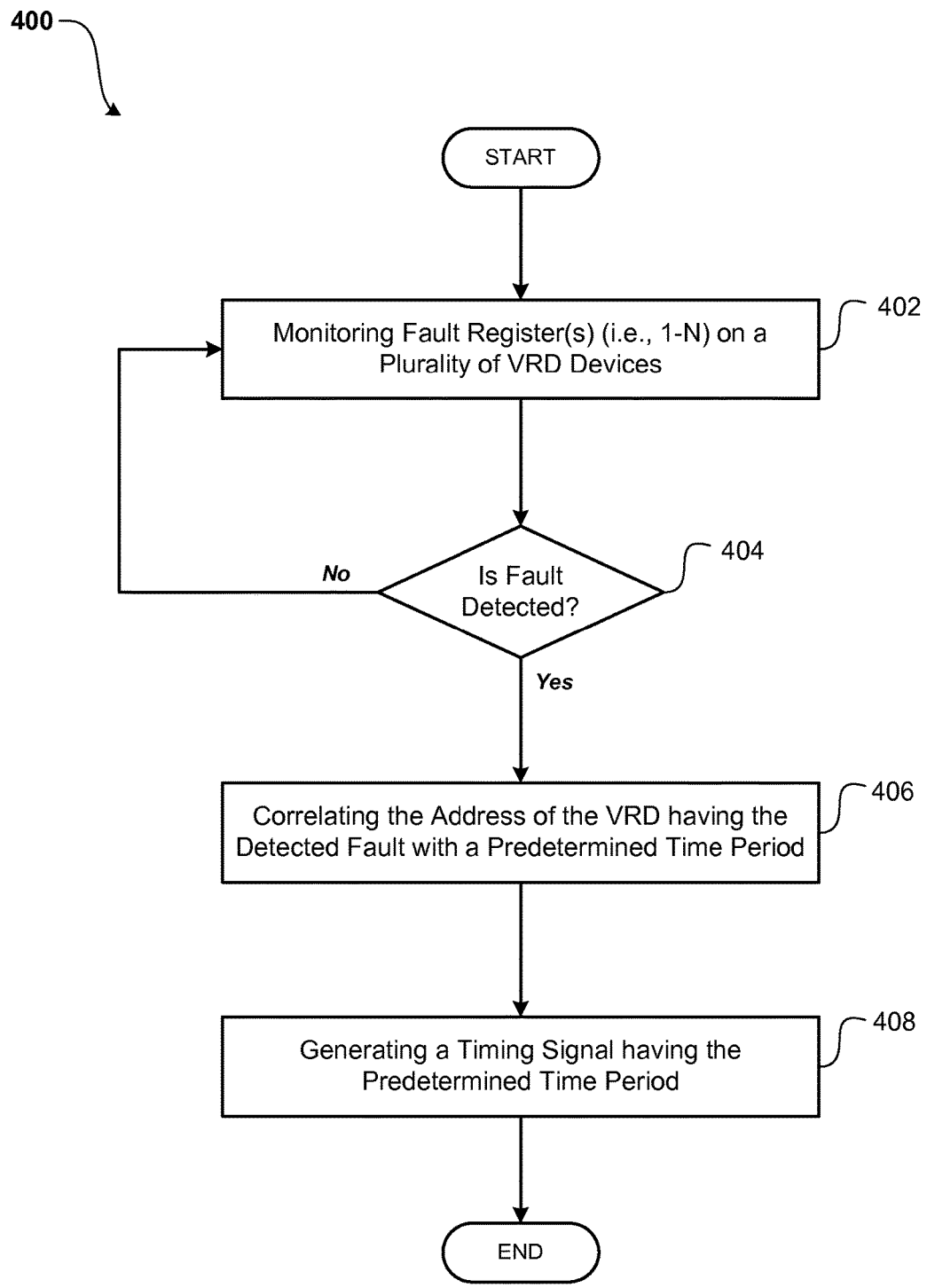
FIG. 4 depicts a process flow diagram describing the operation exemplary timer units associated with the VRD devices of FIG. 3 according to one embodiment.

FIG. 4 depicts a process flow diagram 400 (i.e., VRD fault determination program) describing the operation of the exemplary timer units 306, 306' associated with the VRD devices 302A, 302B of FIG. 3, according to one embodiment. FIG. 4 will be described with the aid of the exemplary embodiment of FIG. 3.

At 402, the one or more fields associated with the fault registers 304a-304c (FIG. 3) of VRD device 302A may be monitored by the timer unit 306 (FIG. 3). The timer unit 306 may detect any changes to one or more fields within one of the fault registers 304a-304c (FIG. 3) as an indication of a detected fault. For example, sensor or fault detection device 302a (FIG. 3) may detect an over-current condition. The detected over-current condition may then be written to the fault register 304a (FIG. 3) coupled to sensor or fault detection device 302a (FIG. 3), whereby the detected over-current condition may be written to the fault register 304a (FIG. 3) as a change to one (e.g., 1-bit flag) or more fields (e.g., n-bit code) within the register 304a (FIG. 3). Accordingly, at 404, the timer unit 306 (FIG. 3) may detect whether a fault has occurred based on, for example, a change to the one (e.g., 1-bit flag) or more fields (e.g., n-bit code) within one of fault registers 304a-304c (FIG. 3).

Similarly, at 402, the one or more fields associated with the fault registers 304a'-304c' (FIG. 3) of VRD device 302B may be monitored by the timer unit 306' (FIG. 3). The timer unit 306' may detect any changes to one or more fields within one of the fault registers 304a'-304c' (FIG. 3) as an indication of a detected fault. For example, sensor or fault detection device 302a' (FIG. 3) may detect an over-current condition. The detected over-current condition may then be written to the fault register 304a' (FIG. 3) coupled to sensor or fault detection device 302a' (FIG. 3), whereby the detected over-current condition may be written to the fault register 304a' (FIG. 3) as a change to one (e.g., 1-bit flag) or more fields (e.g., n-bit code) within the register 304a' (FIG. 3). Accordingly, at 404, the timer unit 306' (FIG. 3) may detect whether a fault has occurred based on, for example, a change to the one (e.g., 1-bit flag) or more fields (e.g., n-bit code) within one of fault registers 304a'-304c' (FIG. 3).

If no fault is detected (404), the process of monitoring the fault registers 304a-304c, 304a'-304c' (FIG. 3) of the VRD devices 302A, 302B (FIG. 3) continues (402). If, however, a fault is detected (404), at 406 the fault register indicating the fault is correlated with a predetermined time period based on the corresponding binary address code within the VRD address associated with the fault register. For example, within VRD device 302A (FIG. 3), when a change to the one (e.g., 1-bit flag) or more fields (e.g., n-bit code) within any one of fault registers 304a-304c (FIG. 3) is detected (404), the timer unit 306 (FIG. 3) reads or accesses the binary address code within the VRD address 309. This accessed or read address code is then mapped or correlated, by the timer unit 306 (FIG. 3), with a corresponding predetermined time duration $t_1$ (e.g., 50 milliseconds). Alternatively, for example, within VRD device 302B (FIG. 3), when a change to the one (e.g., 1-bit flag) or more fields (e.g., n-bit code) within any one of fault register 304a'-304c' (FIG. 3) is detected (404), the timer unit 306' (FIG. 3) reads or accesses the binary address code within the VRD address 309' (FIG. 3). This accessed or read address code is then mapped or correlated, by the timer unit 306' (FIG. 3), with another corresponding predetermined time duration $t_2$ (e.g., 100 milliseconds).

At 408, a timing signal having the predetermined time duration is generated. Accordingly, at VRD device 302A, once a predetermined time duration is determined based on the mapping or correlation (406), the timer unit 306 (FIG. 3) generates a timing signal having a time period corresponding to the predetermined time duration (408). For example, when the timer unit 306 (FIG. 3) maps the binary address code within the VRD address 309 (FIG. 3) to predetermined time duration $t_1$ (e.g., 50 milliseconds), the timer unit 306 (FIG. 3) may accordingly generate a timing signal having a pulse period of predetermined time duration $t_1$ (e.g., 50 milliseconds). Alternatively, at VRD device 302B, once another predetermined time duration is determined based on the mapping or correlation (406), the timer unit 306' (FIG. 3) generates a timing signal having a time period corresponding to the predetermined time duration (408). For example, when the timer unit 306' (FIG. 3) maps the binary address code within the VRD address 309' (FIG. 3) to predetermined time duration $t_2$ (e.g., 100 milliseconds), the timer unit 306' (FIG. 3) may accordingly generate a timing signal having a pulse period of predetermined time duration $t_2$ (e.g., 100 milliseconds).

In operation, the timing signal from the timer unit 306 (FIG. 3) turns FET switch 310 (FIG. 3) ON according to the mapped or correlated predetermined time duration. For example, the predetermined time duration of $t_1$ (e.g., 50 milliseconds) corresponding to a detected fault indicated by fault registers 304a-304c (FIG. 3) may be used to generate a timing signal having a pulse period of $t_1$ (e.g., 50 milliseconds). Applying the timing signal having a pulse period of $t_1$ (e.g., 50 milliseconds) to the gate 311 (FIG. 3) of FET 310 (FIG. 3) accordingly turns the FET 310 to an ON state for the predetermined time duration of $t_1$ (i.e., 50 milliseconds). Also, for example, the predetermined time duration of $t_2$ (e.g., 100 milliseconds) corresponding to a detected fault indicated by fault registers 304a'-304c' (FIG. 3) may be used to generate a timing signal having a pulse period of $t_2$ (e.g., 100 milliseconds). Applying the timing signal having a pulse period of $t_2$ (e.g., 100 milliseconds) to the gate 311' (FIG. 3) of FET 310' (FIG. 3) accordingly turns the FET 310' to an ON state for the predetermined time duration of $t_2$ (i.e., 100 milliseconds).

As previously described, once the FET 310 (FIG. 3) is switched ON for a duration of, for example, $t_1$, current is drawn from supply rail $V_{cc}$ (FIG. 3) to ground GND (FIG. 3) through the branches B'1-B'3 (FIG. 3) of the fuse system 316 (FIG. 3) for duration $t_1$. Thus, based on the FET 310 (FIG. 3) being switched to an ON state for the predetermined time duration of $t_1$ (i.e., 50 milliseconds), current is drawn from supply rail $V_{cc}$ to ground GND through the branches B'1-B'3 (FIG. 3) of the fuse system 316 (FIG. 3) for duration $t_1$ (i.e., 50 milliseconds). Over duration $t_1$, the fuse system 316 (FIG. 3) may be programmed such that fuses 320a-320c are blown according to the binary address code within VRD address 309 (FIG. 3). For example, if the binary address code within VRD address 309 (FIG. 3) is '011', upon activation of FET 310 (FIG. 3) for duration $t_1$, fuse 320a (FIG. 3) within branch B'1 (FIG. 3) blows to create binary pattern '011'.

Alternatively, once the FET 310' (FIG. 3) is switched ON for a duration of, for example, $t_2$, current is drawn from supply rail $V_{cc}$ (FIG. 3) to ground GND (FIG. 3) through the branches B'1-B'3 (FIG. 3) of the fuse system 316 (FIG. 3) for duration $t_2$. Thus, based on the FET 310' (FIG. 3) being switched to an ON state for the predetermined time duration of $t_2$ (i.e., 100 milliseconds), current is drawn from supply rail $V_{cc}$ to ground GND through the branches B'1-B'3 (FIG. 3) of the fuse system 316 (FIG. 3) for duration $t_2$ (i.e., 100 milliseconds). Over duration $t_2$, the fuse system 316 (FIG. 3) may be programmed such that fuses 320a'-320c' are blown according to the binary address code within VRD address 309' (FIG. 3). For example, if the binary address code within VRD address 309' (FIG. 3) is '001', upon activation of FET 310' (FIG. 3) for duration $t_2$, fuses 320a' and 320b' (FIG. 3) within respective branches B'1 and B'2 (FIG. 3) are blown to create binary pattern '001'.

When a fault is detected, in addition to the timing signal blowing the binary fuse system 316 (FIG. 3) according to a preset pattern, the common fault pin output 314 (FIG. 3) may inhibit the power supply from delivering voltage to the various circuits of the system (e.g., server system). However, the fault associated with system power may be determined without the need to power-up the system, which in some scenarios may present a risk of fire. Therefore, an ohm meter, a multi-meter, of other suitable instrumentation device may be utilized to ascertain the blown or unblown status of each the fuses 320a-320c (FIG. 3). For example, an ohm meter or continuity tester may determine the presence of either an open circuit indicative of a blow fuse along each branch B'1-B'3 (FIG. 3), or a closed circuit suggesting that the fuse at each branch is intact.

For example, the ohm meter may measure a binary pattern of '111', whereby none of the fuses are blown. Thus, this may provide an indication of no power faults detected by the fault registers 304a-304c, 304a'-304c' (FIG. 3). According to another example, the ohm meter may measure a binary pattern of '011', whereby one of the fuses are blown. This binary pattern of '011' may provide an indication of a power fault associated with a VRD device having a binary address code of '011' (e.g., VRD device 302A). Since the system engineer may ascertain the location of the fault using the fuses, no power to the system is required in order to allocate the location of the fault.

According to yet another example, the ohm meter may measure a binary pattern of '001', whereby two of the fuses are blown. This binary pattern of '001' may provide an indication of a power fault associated with a VRD device having a binary address code of '001' (e.g., VRD device 302B). Since the system engineer may ascertain the location of the fault using the fuses, again, no power to the system may be required in order to allocate the location of the fault.

Figure 5:
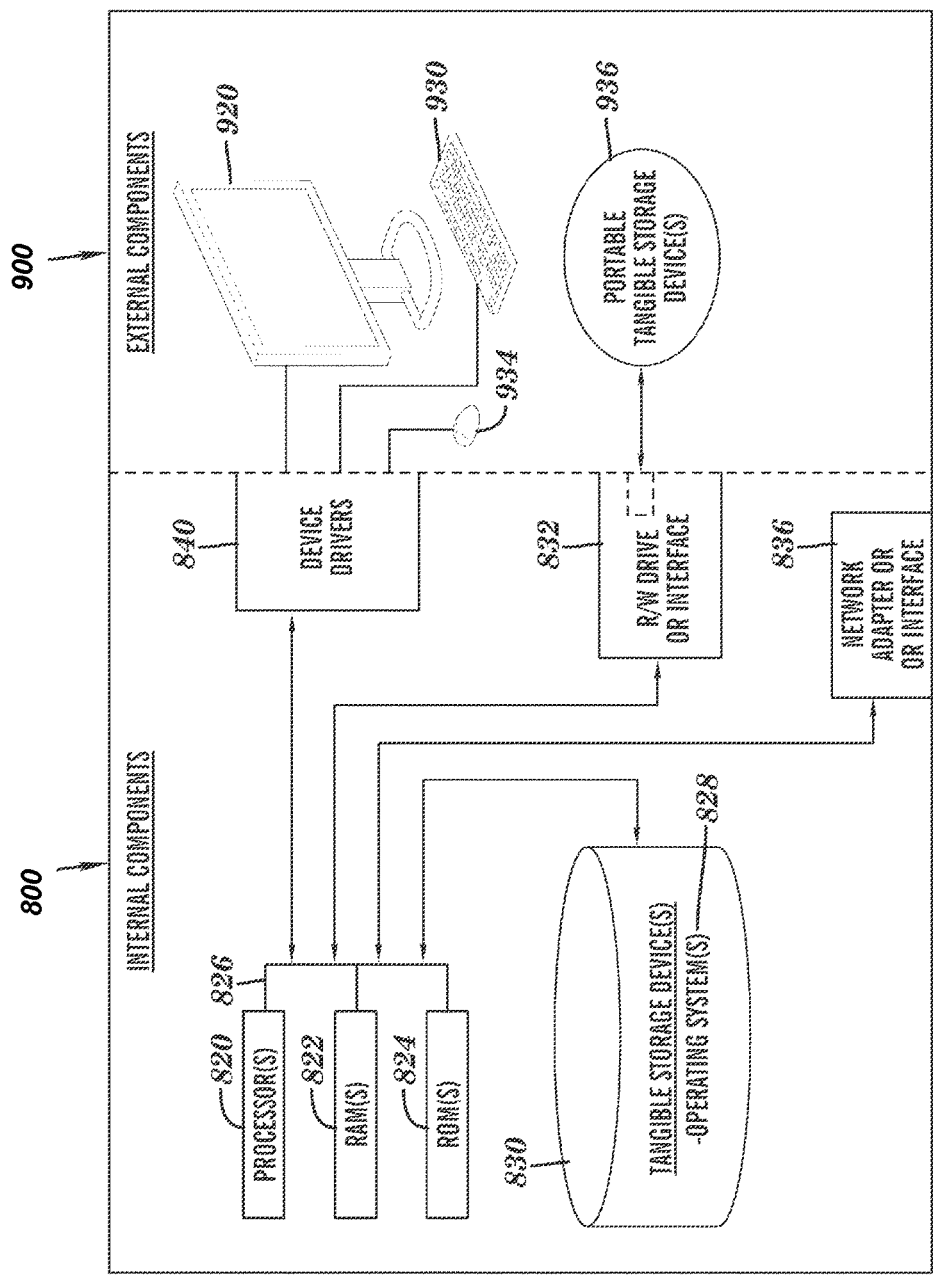
FIG. 5 is a block diagram of hardware and software for executing the process flows of FIGS. 2 and 4 according to one embodiment.

FIG. 5 shows a block diagram of the components of a data processing system 800, 900, implemented as, for example, timer units 106 (FIG. 1), 306 (FIG. 3), and 306' (FIG. 3) in accordance with an illustrative embodiment of the present invention. It should be appreciated that FIG. 5 provides only an illustration of one implementation and does not imply any limitations with regard to the environments in which different embodiments may be implemented. Many modifications to the depicted environments may be made based on design and implementation requirements.

Data processing system 800, 900 is representative of any electronic device capable of executing machine-readable program instructions. Data processing system 800, 900 may be representative of a smart phone, a computer system, PDA, or other electronic devices. Examples of computing systems, environments, and/or configurations that may be represented by data processing system 800, 900 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

Timer units 106 (FIG. 1), 306 (FIG. 3), and 306' (FIG. 3) may each include internal component 800 and external component 900 illustrated in FIG. 5. The internal component 800 includes one or more processors 820, one or more computer-readable RAMs 822 and one or more computer-readable ROMs 824 on one or more buses 826, and one or more operating systems 828 and one or more computer-readable tangible storage devices 830. The one or more operating systems 828 and programs such as the VRD fault determination programs 200 (FIG. 2), 400 (FIG. 4) corresponding to the timer units 106 (FIG. 1), 306 (FIG. 3), 306' (FIG. 3) are stored on one or more computer-readable tangible storage devices 830 for execution by one or more processors 820 via one or more RAMs 822 (which typically include cache memory). In the embodiment illustrated in FIG. 5, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Internal component 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. The VRD fault determination programs 200 (FIG. 2), 400 (FIG. 4) associated with the timer units 106 (FIG. 1), 306 (FIG. 3), 306' (FIG. 3) can be stored on one or more of the respective portable computer-readable tangible storage devices 936, read via the respective R/W drive or interface 832 and loaded into the respective hard drive 830.

Internal component 800 may also include network adapters (or switch port cards) or interfaces 836 such as a TCP/IP adapter cards, wireless wi-fi interface cards, or 3G or 4G wireless interface cards or other wired or wireless communication links. The VRD fault determination programs 200 (FIG. 2), 400 (FIG. 4) can be downloaded to the filter monitor 104 (FIG. 1) from an external computer (e.g., server) via a network (for example, the Internet, a local area network or other, wide area network) and respective network adapters or interfaces 836. From the network adapters (or switch port adaptors) or interfaces 836, the VRD fault determination programs 200 (FIG. 2), 400 (FIG. 4) associated with the timer units 106 (FIG. 1), 306 (FIG. 3), 306' (FIG. 3) are loaded into the respective hard drive 830. The network may comprise copper wires, optical fibers, wireless transmission, routers, firewalls, switches, gateway computers and/or edge servers.

External component 900 can include a computer display monitor 920, a keyboard 930, and a computer mouse 934. External component 900 can also include touch screens, virtual keyboards, touch pads, pointing devices, and other human interface devices. Internal component 800 also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Smalltalk, C, and C++. The program code may execute entirely on the user's computer, partly on the user's computer, as a stand-alone software package, partly on the user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

According to other exemplary embodiments, a computer system for determining power fault information using a voltage regulator-down (VRD) device having a fault-pin output is provided. The computer system may include one or more processors, one or more computer-readable memories, one or more computer-readable tangible storage devices, and program instructions stored on at least one of the one or more storage devices for execution by at least one of the one or more processors via at least one of the one or more memories. The computer system is capable of performing a method that may include receiving a fault indication from one of a plurality of fault detection devices, correlating the received fault indication with a timing signal having a predetermined time duration, applying a voltage change on the fault-pin output of the VRD device for the predetermined time duration corresponding to the timing signal, and applying the voltage change on the fault-pin output to a plurality of fuses. Based on the predetermined time duration associated with the applied voltage change, the plurality of fuses are blown according to a binary pattern indicative of a fault type associated with the fault indication.

According to other exemplary embodiments, a computer program product for determining power fault information using a voltage regulator-down (VRD) device having a fault-pin output may include one or more tangible computer-readable storage medium and program instructions stored on at least one of the one or more tangible storage medium, such that the program instructions are executable by a processor. The program instructions may include receiving a fault indication from one of a plurality of fault detection devices, correlating the received fault indication with a timing signal having a predetermined time duration, applying a voltage change on the fault-pin output of the VRD device for the predetermined time duration corresponding to the timing signal, and applying the voltage change on the fault-pin output to a plurality of fuses. Based on the predetermined time duration associated with the applied voltage change, the plurality of fuses are blown according to a binary pattern indicative of a fault type associated with the fault indication.

According to other exemplary embodiments, a computer system for determining a power fault using a plurality of voltage regulator-down (VRD) devices having a common fault-pin output is provided. The computer system may include one or more processors, one or more computer-readable memories, one or more computer-readable tangible storage medium, and program instructions stored on at least one of the one or more storage medium for execution by at least one of the one or more processors via at least one of the one or more memories. The computer system is capable of performing a method that may include receiving a fault indication at one of the plurality of VRD devices, determining the address of the one of the plurality of VRD devices receiving the fault indication, correlating the address of the one of the plurality of VRD devices receiving the fault indication with a timing signal having a predetermined time duration, applying a voltage change on the common fault-pin output of the plurality of VRD devices for the predetermined time duration corresponding to the timing signal, and applying the voltage change on the common fault-pin output to a plurality of fuses for the predetermined time duration. Based on the predetermined time duration associated with the applied voltage change, the plurality of fuses are blown according to a binary pattern indicative of the address of the one of the plurality of VRD devices.

According to other exemplary embodiments, a computer program product for determining a power fault using a plurality of voltage regulator-down (VRD) devices having a common fault-pin output may include one or more tangible computer-readable storage devices and program instructions stored on at least one of the one or more tangible storage devices, such that the program instructions are executable by a processor. The program instructions may include receiving a fault indication at one of the plurality of VRD devices, determining the address of the one of the plurality of VRD devices receiving the fault indication, correlating the address of the one of the plurality of VRD devices receiving the fault indication with a timing signal having a predetermined time duration, applying a voltage change on the common fault-pin output of the plurality of VRD devices for the predetermined time duration corresponding to the timing signal, and applying the voltage change on the common fault-pin output to a plurality of fuses for the predetermined time duration. Based on the predetermined time duration associated with the applied voltage change, the plurality of fuses are blown according to a binary pattern indicative of the address of the one of the plurality of VRD devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A method of determining power fault information using a voltage regulator-down (VRD) device having a fault-pin output, the method comprising:

receiving a fault indication from one of a plurality of fault detection devices;

correlating the received fault indication with a timing signal having a predetermined time duration;

applying a voltage change on the fault-pin output of the VRD device for the predetermined time duration corresponding to the timing signal; and applying the voltage change on the fault-pin output to a plurality of fuses, wherein based on the predetermined time duration associated with the applied voltage change, the plurality of fuses are blown according to a binary pattern indicative of a fault type associated with the fault indication.

2. The method of claim 1, wherein the binary pattern corresponds to $2^N$ patterns given by N of the plurality of fuses coupled in parallel.

3. The method of claim 1, wherein the correlating the received fault indication comprises using a lookup table to map the received fault indication with the corresponding timing signal having the predetermined time duration.

4. The method of claim 3, wherein the receiving the fault indication comprises the plurality of fault detection devices sensing one of an over-current condition, an under-current condition, an over-voltage condition, an under-voltage condition, and an over-temperature condition.

5. The method of claim 1, further comprising:
  determining, using a measurement device, the plurality of fuses that are blown according to a binary pattern.

6. The method of claim 5, wherein the measurement device comprises an ohm meter device.

7. A method of determining a power fault using a plurality of voltage regulator-down (VRD) devices having a common fault-pin output, the method comprising:
  receiving a fault indication at one of the plurality of VRD devices;
  determining the address of the one of the plurality of VRD devices receiving the fault indication;
  correlating the address of the one of the plurality of VRD devices receiving the fault indication with a timing signal having a predetermined time duration;
  applying a voltage change on the common fault-pin output of the plurality of VRD devices for the predetermined time duration corresponding to the timing signal; and
  applying the voltage change on the common fault-pin output to a plurality of fuses for the predetermined time duration,
  wherein based on the predetermined time duration associated with the applied voltage change, the plurality of fuses are blown according to a binary pattern indicative of the address of the one of the plurality of VRD devices.

8. The method of claim 7, wherein the binary pattern corresponds to $2^N$ patterns given by N of the plurality of fuses coupled in parallel.

9. The method of claim 7, wherein the correlating the address of the one of the plurality of VRD devices comprises using a lookup table to map the address with the corresponding timing signal having the predetermined time duration.

10. The method of claim 7, further comprising:
  determining, using a measurement device, the plurality of fuses that are blown according to a binary pattern.

11. The method of claim 10, wherein the measurement device comprises an ohm meter device.

12. The method of claim 7, wherein the address of the one of the plurality of VRD devices receiving the fault indication comprises a location associated with the received fault.

13. The method of claim 7, wherein the receiving the fault indication at one of the plurality of VRD devices comprises receiving the fault indication from one of a plurality of fault detection devices.

14. A voltage regulator-down (VRD) device for generating power fault information, comprising:
  a plurality of fault registers that are each configured to receive and store a fault indication;
  a timer unit coupled to the plurality of fault registers, the timer unit configured to detect that one of the plurality of fault registers has received and stored a fault indication,
  correlate the one of the plurality of fault registers with a respective one of a plurality of predetermined time durations, and generate a timing signal having the respective one of the plurality of predetermined time durations; and
  a switch device coupled to both the timer unit and a fault-pin output, the switch device configured to apply a voltage change on the fault-pin output for the respective one of the plurality of predetermined time durations correlated with the received fault indication.

15. The device of claim 14, wherein the plurality of fault registers comprise a first fault register that indicates an over temperature condition, a second fault register that indicates an over-current condition, a third fault register that indicates an under-current condition, a fourth fault register that indicates an over-voltage condition, and a fifth fault register that indicates an under-voltage condition.

16. The device of claim 14, wherein the timer unit comprises a lookup table that correlates each of the fault registers to the one of the plurality of predetermined time durations.

17. The device of claim 14, wherein the plurality of fuses form a binary fuse system coupled between a supply voltage and the fault-pin output, wherein the plurality of fuses are blown according to a binary pattern based on the switch device applying the voltage change of the fault-pin output for the one of the plurality of predetermined time durations, the binary pattern being indicative of a fault type associated with one of the plurality of fault registers.

18. The device of claim 17, wherein the switch device comprises a Field Effect Transistor (FET) device that couples the fault-pin output to ground for the one of the plurality of predetermined time durations, wherein current flows between the supply voltage and ground via the plurality of fuses of the binary fuse system.

19. The device of claim 14, further comprising:
  a VRD device address corresponding to the VRD device; and
  at least one other VRD device address corresponding to at least one other voltage regulator-down (VRD) device.

20. The device of claim 19, further comprising:
  a lookup table associated with the VRD device; and
  at least one other lookup table associated with the at least one other VRD device,
    wherein the lookup table correlates the VRD device address to the one of the plurality of predetermined time durations, and wherein the at least one other lookup table correlates the at least one other VRD device address with another one of the plurality of predetermined time durations.

* * * * *